United States Patent
Gaal et al.

(10) Patent No.: US 8,854,945 B2
(45) Date of Patent: Oct. 7, 2014

(54) ENHANCED ADAPTIVE GAIN CONTROL IN HETEROGENEOUS NETWORKS

(75) Inventors: Peter Gaal, San Diego, CA (US); Zhifei Fan, San Diego, CA (US); Yongbin Wei, San Diego, CA (US); Hao Xu, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 386 days.

(21) Appl. No.: 13/292,985

(22) Filed: Nov. 9, 2011

(65) Prior Publication Data

US 2013/0114519 A1    May 9, 2013

(51) Int. Cl.
| | |
|---|---|
| *H04L 12/28* | (2006.01) |
| *H04W 52/16* | (2009.01) |
| *H03G 3/30* | (2006.01) |
| *H04J 1/16* | (2006.01) |
| *H04W 52/24* | (2009.01) |

(52) U.S. Cl.
CPC ........... *H03G 3/3078* (2013.01); *H04W 52/244* (2013.01); *H04W 52/16* (2013.01)
USPC ........................ 370/210; 370/252; 370/430

(58) Field of Classification Search
CPC ............................ H03G 3/3078; H04W 52/16
USPC .......................................... 370/210, 252, 430
See application file for complete search history.

(56) References Cited

U.S. PATENT DOCUMENTS

| | | | |
|---|---|---|---|
| 5,825,832 A * | 10/1998 | Benedetto ...................... 375/341 |
| 6,628,735 B1 * | 9/2003 | Belotserkovsky et al. ... 375/355 |
| 7,970,066 B1 * | 6/2011 | Lee et al. ....................... 375/260 |
| 2005/0009483 A1 * | 1/2005 | Eilts et al. ....................... 455/136 |
| 2007/0135166 A1 * | 6/2007 | Ding et al. ..................... 455/561 |
| 2007/0160154 A1 * | 7/2007 | Sukkar .......................... 375/242 |
| 2008/0219332 A1 | 9/2008 | Brehler |
| 2009/0074042 A1 * | 3/2009 | Lin ................................ 375/224 |
| 2010/0136935 A1 | 6/2010 | Plevridis |
| 2010/0190459 A1 | 7/2010 | Li et al. |
| 2010/0272219 A1 * | 10/2010 | Andgart et al. ................ 375/345 |
| 2011/0096854 A1 * | 4/2011 | Fanson ........................... 375/260 |
| 2012/0307761 A1 * | 12/2012 | Zhang et al. ................... 370/329 |

FOREIGN PATENT DOCUMENTS

| | | |
|---|---|---|
| JP | 2003060605 A | 2/2003 |
| JP | 2004173107 A | 6/2004 |
| WO | WO2011022404 | 2/2011 |

OTHER PUBLICATIONS

Jun Hee Jang et al., "A Fast Automatic Gain Control Scheme for 3GPP LTE TDD System", Vehicular Technology Conference Fall (VTC 2010-Fall), 2010 IEEE 72nd, Sep. 2010, pp. 1-5.
International Search Report and Written Opinion—PCT/US2012/063919—ISA/EPO—Feb. 7, 2013.

* cited by examiner

*Primary Examiner* — John Pezzlo
(74) *Attorney, Agent, or Firm* — Seyfarth Shaw LLP

(57) ABSTRACT

In wireless communications, adaptive gain control may be performed by scaling of signals before and after a transform. A received signal power may be non-causally scaled to a first level within a desired range before transforming the received signal. The scaled signal is transformed between a time domain to a frequency domain and then its power is again non-causally scaled based on the first level. A feed forward circuit may be used in the power scaling. Different portions of the signal may be power adjusted independently of other portions. The different portions may be separated on a per-channel basis. Power scaling may be done on a symbol-by-symbol basis.

24 Claims, 7 Drawing Sheets

ENHANCED ADAPTIVE GAIN CONTROL IN HETEROGENEOUS NETWORKS

BACKGROUND

1. Field

Aspects of the present disclosure relate generally to wireless communication systems, and more particularly to enhanced adaptive gain control in heterogeneous networks.

2. Background

Wireless communication networks are widely deployed to provide various communication services such as voice, video, packet data, messaging, broadcast, etc. These wireless networks may be multiple-access networks capable of supporting multiple users by sharing the available network resources. Examples of such multiple-access networks include Code Division Multiple Access (CDMA) networks, Time Division Multiple Access (TDMA) networks, Frequency Division Multiple Access (FDMA) networks, Orthogonal FDMA (OFDMA) networks, and Single-Carrier FDMA (SC-FDMA) networks.

A wireless communication network may include a number of base stations that can support communication for a number of user equipments (UEs). A UE may communicate with a base station via the downlink and uplink. The downlink (or forward link) refers to the communication link from the base station to the UE, and the uplink (or reverse link) refers to the communication link from the UE to the base station.

A base station may transmit data and control information on the downlink to a UE and/or may receive data and control information on the uplink from the UE. On the downlink, a transmission from the base station may encounter interference due to transmissions from neighbor base stations or from other wireless radio frequency (RF) transmitters. On the uplink, a transmission from the UE may encounter interference from uplink transmissions of other UEs communicating with the neighbor base stations or from other wireless RF transmitters. This interference may degrade performance on both the downlink and uplink.

As the demand for mobile broadband access continues to increase, the possibilities of interference and congested networks grows with more UEs accessing the long-range wireless communication networks and more short-range wireless systems being deployed in communities. Research and development continue to advance the UMTS technologies not only to meet the growing demand for mobile broadband access, but to advance and enhance the user experience with mobile communications.

SUMMARY

A method for adaptive gain control (AGC) in wireless communications is offered. The method includes non-causally scaling power of a received signal to a first level within a desired range before transforming the received signal. The method also includes transforming the power scaled signal from a time domain to a frequency domain. The method further includes non-causally scaling power of the transformed signal to a second level, based at least in part on the scaling of the received signal to the first level.

An apparatus for adaptive gain control (AGC) in wireless communication is offered. The apparatus includes means for non-causally scaling power of a received signal to a first level within a desired range before transforming the received signal. The apparatus also includes means for transforming the power scaled signal from a time domain to a frequency domain. The apparatus further includes means for non-causally scaling power of the transformed signal to a second level, based at least in part on the scaling of the received signal to the first level.

A computer program product for adaptive gain control (AGC) in wireless communication in a wireless network is offered. The computer program product includes a non-transitory computer-readable medium having non-transitory program code recorded thereon. The non-transitory program code includes program code to non-causally scale power of a received signal to a first level within a desired range before transforming the received signal. The non-transitory program code also includes program code to transform the power scaled signal from a time domain to a frequency domain. The non-transitory program code further includes program code to non-causally scale power of the transformed signal to a second level, based at least in part on the scaling of the received signal to the first level.

An apparatus for adaptive gain control (AGC) in wireless communication is offered. The apparatus includes a memory and a processor(s) coupled to the memory. The processor(s) is configured to non-causally scale power of a received signal to a first level within a desired range before transforming the received signal. The processor(s) is also configured to transform the power scaled signal from a time domain to a frequency domain. The processor(s) is further configured to non-causally scale power of the transformed signal to a second level, based at least in part on the scaling of the received signal to the first level.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

The features, nature, and advantages of the present disclosure will become more apparent from the detailed description set forth below when taken in conjunction with the drawings in which like reference characters identify correspondingly throughout.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

The techniques described herein may be used for various wireless communication networks such as CDMA, TDMA, FDMA, OFDMA, SC-FDMA and other networks. The terms "network" and "system" are often used interchangeably. A CDMA network may implement a radio technology, such as Universal Terrestrial Radio Access (UTRA), Telecommunications Industry Association's (TIA's) CDMA2000®, and the like. The UTRA technology includes Wideband CDMA (WCDMA) and other variants of CDMA. The CDMA2000® technology includes the IS-2000, IS-95 and IS-856 standards from the Electronics Industry Alliance (ETA) and TIA. A TDMA network may implement a radio technology, such as Global System for Mobile Communications (GSM). An OFDMA network may implement a radio technology, such as Evolved UTRA (E-UTRA), Ultra Mobile Broadband (UMB), IEEE 802.11 (Wi-Fi), IEEE 802.16 (WiMAX), IEEE 802.20, Flash-OFDMA, and the like. The UTRA and E-UTRA technologies are part of Universal Mobile Telecommunication System (UMTS). 3GPP Long Term Evolution (LTE) and LTE-Advanced (LTE-A) are newer releases of the UMTS that use E-UTRA. UTRA, E-UTRA, UMTS, LTE, LTE-A and GSM are described in documents from an organization called the "3rd Generation Partnership Project" (3GPP). CDMA2000® and UMB are described in documents from an organization called the "3rd Generation Partnership Project 2" (3GPP2). The techniques described herein may be used for the wireless networks and radio access technologies mentioned above, as well as other wireless networks and radio access technologies. For clarity, certain aspects of the techniques are described below for LTE or LTE-A (together referred to in the alternative as "LTE/-A") and use such LTE/-A terminology in much of the description below.

Figure 1:
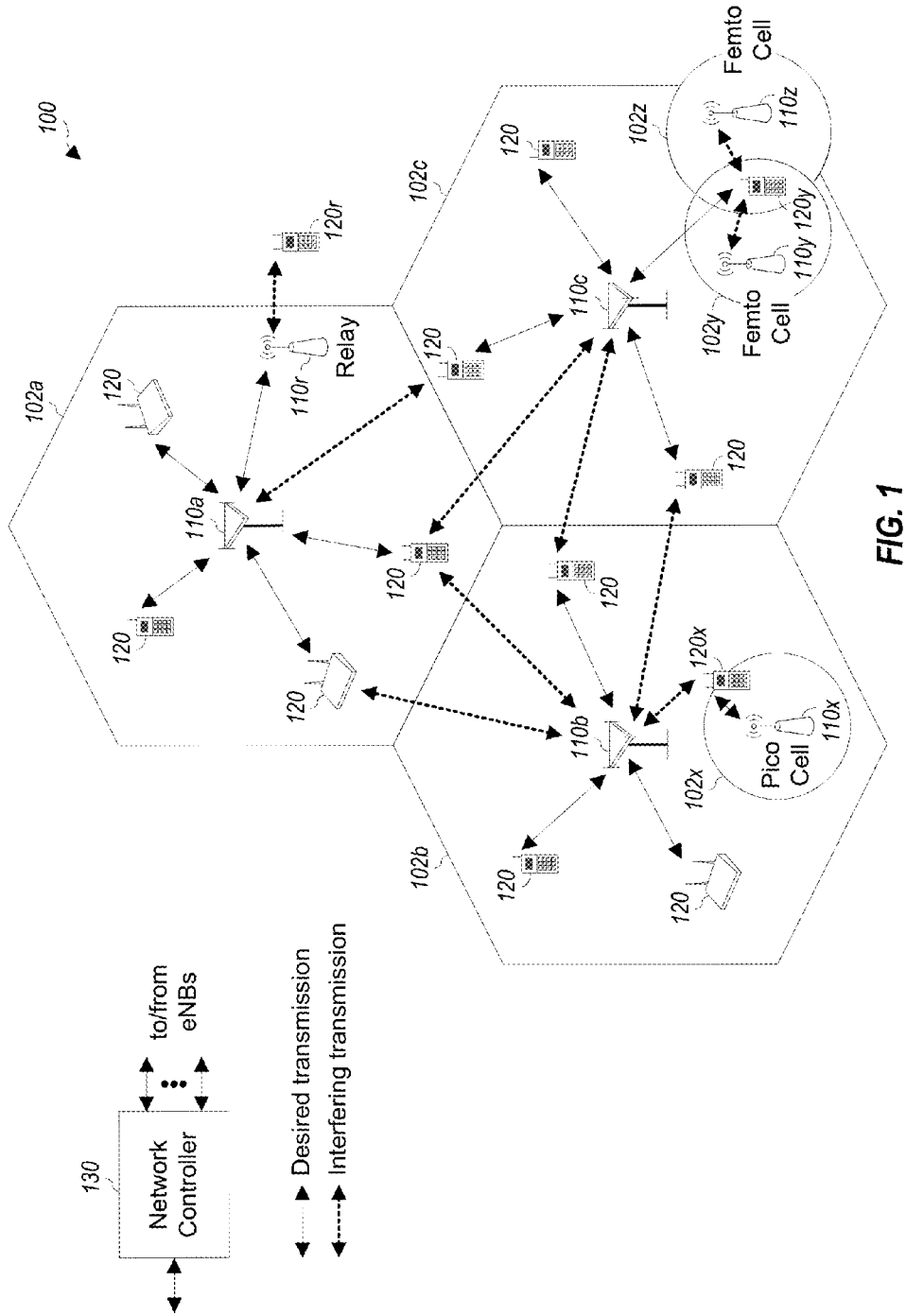
FIG. 1 is a block diagram conceptually illustrating an example of a telecommunications system.

FIG. 1 shows a wireless communication network 100, which may be an LTE-A network, in which enhanced adaptive gain control for heterogeneous networks may be implemented. The wireless network 100 includes a number of evolved node Bs (eNodeBs) 110 and other network entities. An eNodeB may be a station that communicates with the UEs and may also be referred to as a base station, a node B, an access point, and the like. Each eNodeB 110 may provide communication coverage for a particular geographic area. In 3GPP, the term "cell" can refer to this particular geographic coverage area of an eNodeB and/or an eNodeB subsystem serving the coverage area, depending on the context in which the term is used.

An eNodeB may provide communication coverage for a macro cell, a pico cell, a femto cell, and/or other types of cell. A macro cell generally covers a relatively large geographic area (e.g., several kilometers in radius) and may allow unrestricted access by UEs with service subscriptions with the network provider. A pico cell would generally cover a relatively smaller geographic area and may allow unrestricted access by UEs with service subscriptions with the network provider. A femto cell would also generally cover a relatively small geographic area (e.g., a home) and, in addition to unrestricted access, may also provide restricted access by UEs having an association with the femto cell (e.g., UEs in a closed subscriber group (CSG), UEs for users in the home, and the like). An eNodeB for a macro cell may be referred to as a macro eNodeB. An eNodeB for a pico cell may be referred to as a pico eNodeB. And, an eNodeB for a femto cell may be referred to as a femto eNodeB or a home eNodeB. In the example shown in FIG. 1, the eNodeBs 110a, 110b and 110c are macro eNodeBs for the macro cells 102a, 102b and 102c, respectively. The eNodeB 110x is a pico eNodeB for a pico cell 102x. And, the eNodeBs 110y and 110z are femto eNodeBs for the femto cells 102y and 102z, respectively. An eNodeB may support one or multiple (e.g., two, three, four, and the like) cells.

The wireless network 100 may also include relay stations. A relay station is a station that receives a transmission of data and/or other information from an upstream station (e.g., an eNodeB, UE, etc.) and sends a transmission of the data and/or other information to a downstream station (e.g., a UE or an eNodeB). A relay station may also be a UE that relays transmissions for other UEs. In the example shown in FIG. 1, a relay station 110r may communicate with the eNodeB 110a and a UE 120r in order to facilitate communication between the eNodeB 110a and the UE 120r. A relay station may also be referred to as a relay eNodeB, a relay, etc.

The wireless network 100 may be a heterogeneous network that includes eNodeBs of different types, e.g., macro eNodeBs, pico eNodeBs, femto eNodeBs, relays, etc. These different types of eNodeBs may have different transmit power levels, different coverage areas, and different impact on interference in the wireless network 100. For example, macro eNodeBs may have a high transmit power level (e.g., 20 Watts) whereas pico eNodeBs, femto eNodeBs and relays may have a lower transmit power level (e.g., 1 Watt).

The wireless network 100 may support synchronous or asynchronous operation. For synchronous operation, the eNodeBs may have similar frame timing, and transmissions from different eNodeBs may be approximately aligned in time. For asynchronous operation, the eNodeBs may have different frame timing, and transmissions from different eNodeBs may not be aligned in time. The techniques described herein may be used for either synchronous or asynchronous operations.

In one aspect, the wireless network 100 may support Frequency Division Duplex (FDD) or Time Division Duplex (TDD) modes of operation. The techniques described herein may be used for either FDD or TDD mode of operation.

A network controller 130 may couple to a set of eNodeBs 110 and provide coordination and control for these eNodeBs 110. The network controller 130 may communicate with the eNodeBs 110 via a backhaul. The eNodeBs 110 may also communicate with one another, e.g., directly or indirectly via a wireless backhaul or a wireline backhaul.

The UEs 120 are dispersed throughout the wireless network 100, and each UE may be stationary or mobile. A UE may also be referred to as a terminal, a mobile station, a subscriber unit, a station, or the like. A UE may be a cellular phone, a personal digital assistant (PDA), a wireless modem, a wireless communication device, a handheld device, a laptop computer, a cordless phone, a wireless local loop (WLL)

station, a tablet, or the like. A UE may be able to communicate with macro eNodeBs, pico eNodeBs, femto eNodeBs, relays, and the like. In FIG. 1, a solid line with double arrows indicates desired transmissions between a UE and a serving eNodeB, which is an eNodeB designated to serve the UE on the downlink and/or uplink. A dashed line with double arrows indicates interfering transmissions between a UE and an eNodeB.

LTE utilizes orthogonal frequency division multiplexing (OFDM) on the downlink and single-carrier frequency division multiplexing (SC-FDM) on the uplink. OFDM and SC-FDM partition the system bandwidth into multiple (K) orthogonal subcarriers, which are also commonly referred to as tones, bins, or the like. Each subcarrier may be modulated with data. In general, modulation symbols are sent in the frequency domain with OFDM and in the time domain with SC-FDM. The spacing between adjacent subcarriers may be fixed, and the total number of subcarriers (K) may be dependent on the system bandwidth. For example, the spacing of the subcarriers may be 15 kHz and the minimum resource allocation (called a 'resource block') may be 12 subcarriers (or 180 kHz). Consequently, the nominal FFT size may be equal to 128, 256, 512, 1024 or 2048 for a corresponding system bandwidth of 1.25, 2.5, 5, 10 or 20 megahertz (MHz), respectively. The system bandwidth may also be partitioned into sub-bands. For example, a sub-band may cover 1.08 MHz (i.e., 6 resource blocks), and there may be 1, 2, 4, 8 or 16 sub-bands for a corresponding system bandwidth of 1.25, 2.5, 5, 10, 15 or 20 MHz, respectively.

Figure 2:
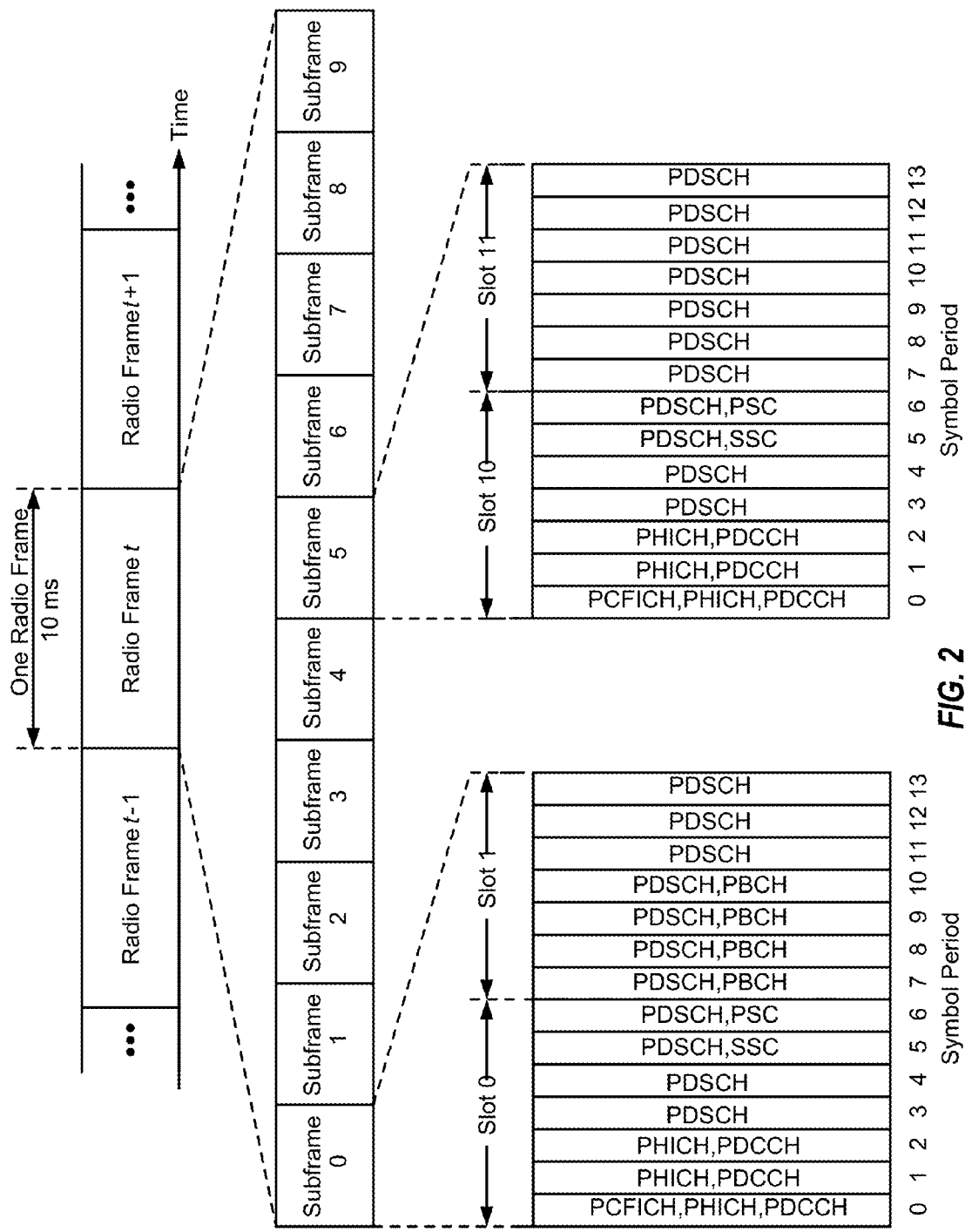
FIG. 2 is a diagram conceptually illustrating an example of a downlink frame structure in a telecommunications system.

FIG. 2 shows a downlink FDD frame structure used in LTE. The transmission timeline for the downlink may be partitioned into units of radio frames. Each radio frame may have a predetermined duration (e.g., 10 milliseconds (ms)) and may be partitioned into 10 subframes with indices of 0 through 9. Each subframe may include two slots. Each radio frame may thus include 20 slots with indices of 0 through 19. Each slot may include L symbol periods, e.g., 7 symbol periods for a normal cyclic prefix (as shown in FIG. 2) or 6 symbol periods for an extended cyclic prefix. The 2L symbol periods in each subframe may be assigned indices of 0 through 2L−1. The available time frequency resources may be partitioned into resource blocks. Each resource block may cover N subcarriers (e.g., 12 subcarriers) in one slot.

In LTE, an eNodeB may send a primary synchronization signal (PSC or PSS) and a secondary synchronization signal (SSC or SSS) for each cell in the eNodeB. For FDD mode of operation, the primary and secondary synchronization signals may be sent in symbol periods 6 and 5, respectively, in each of subframes 0 and 5 of each radio frame with the normal cyclic prefix, as shown in FIG. 2. The synchronization signals may be used by UEs for cell detection and acquisition. For FDD mode of operation, the eNodeB may send a Physical Broadcast Channel (PBCH) in symbol periods 0 to 3 in slot 1 of subframe 0. The PBCH may carry certain system information.

The eNodeB may send a Physical Control Format Indicator Channel (PCFICH) in the first symbol period of each subframe, as seen in FIG. 2. The PCFICH may convey the number of symbol periods (M) used for control channels, where M may be equal to 1, 2 or 3 and may change from subframe to subframe. M may also be equal to 4 for a small system bandwidth, e.g., with less than 10 resource blocks. In the example shown in FIG. 2, M=3. The eNodeB may send a Physical HARQ Indicator Channel (PHICH) and a Physical Downlink Control Channel (PDCCH) in the first M symbol periods of each subframe. The PDCCH and PHICH are also included in the first three symbol periods in the example shown in FIG. 2. The PHICH may carry information to support hybrid automatic repeat request (HARQ). The PDCCH may carry information on uplink and downlink resource allocation for UEs and power control information for uplink channels. The eNodeB may send a Physical Downlink Shared Channel (PDSCH) in the remaining symbol periods of each subframe. The PDSCH may carry data for UEs scheduled for data transmission on the downlink.

The eNodeB may send the PSC, SSC and PBCH in the center 1.08 MHz of the system bandwidth used by the eNodeB. The eNodeB may send the PCFICH and PHICH across the entire system bandwidth in each symbol period in which these channels are sent. The eNodeB may send the PDCCH to groups of UEs in certain portions of the system bandwidth. The eNodeB may send the PDSCH to groups of UEs in specific portions of the system bandwidth. The eNodeB may send the PSC, SSC, PBCH, PCFICH and PHICH in a broadcast manner to all UEs, may send the PDCCH in a unicast manner to specific UEs, and may also send the PDSCH in a unicast manner to specific UEs.

A number of resource elements may be available in each symbol period. Each resource element may cover one subcarrier in one symbol period and may be used to send one modulation symbol, which may be a real or complex value. For symbols that are used for control channels, the resource elements not used for a reference signal in each symbol period may be arranged into resource element groups (REGs). Each REG may include four resource elements in one symbol period. The PCFICH may occupy four REGs, which may be spaced approximately equally across frequency, in symbol period 0. The PHICH may occupy three REGs, which may be spread across frequency, in one or more configurable symbol periods. For example, the three REGs for the PHICH may all belong in symbol period 0 or may be spread in symbol periods 0, 1 and 2. The PDCCH may occupy 9, 18, 36 or 72 REGs, which may be selected from the available REGs, in the first M symbol periods. Only certain combinations of REGs may be allowed for the PDCCH.

A UE may know the specific REGs used for the PHICH and the PCFICH. The UE may search different combinations of REGs for the PDCCH. The number of combinations to search is typically less than the number of allowed combinations for all UEs in the PDCCH. An eNodeB may send the PDCCH to the UE in any of the combinations that the UE will search.

A UE may be within the coverage of multiple eNodeBs. One of these eNodeBs may be selected to serve the UE. The serving eNodeB may be selected based on various criteria such as received power, path loss, signal-to-noise ratio (SNR), etc.

Figure 3:
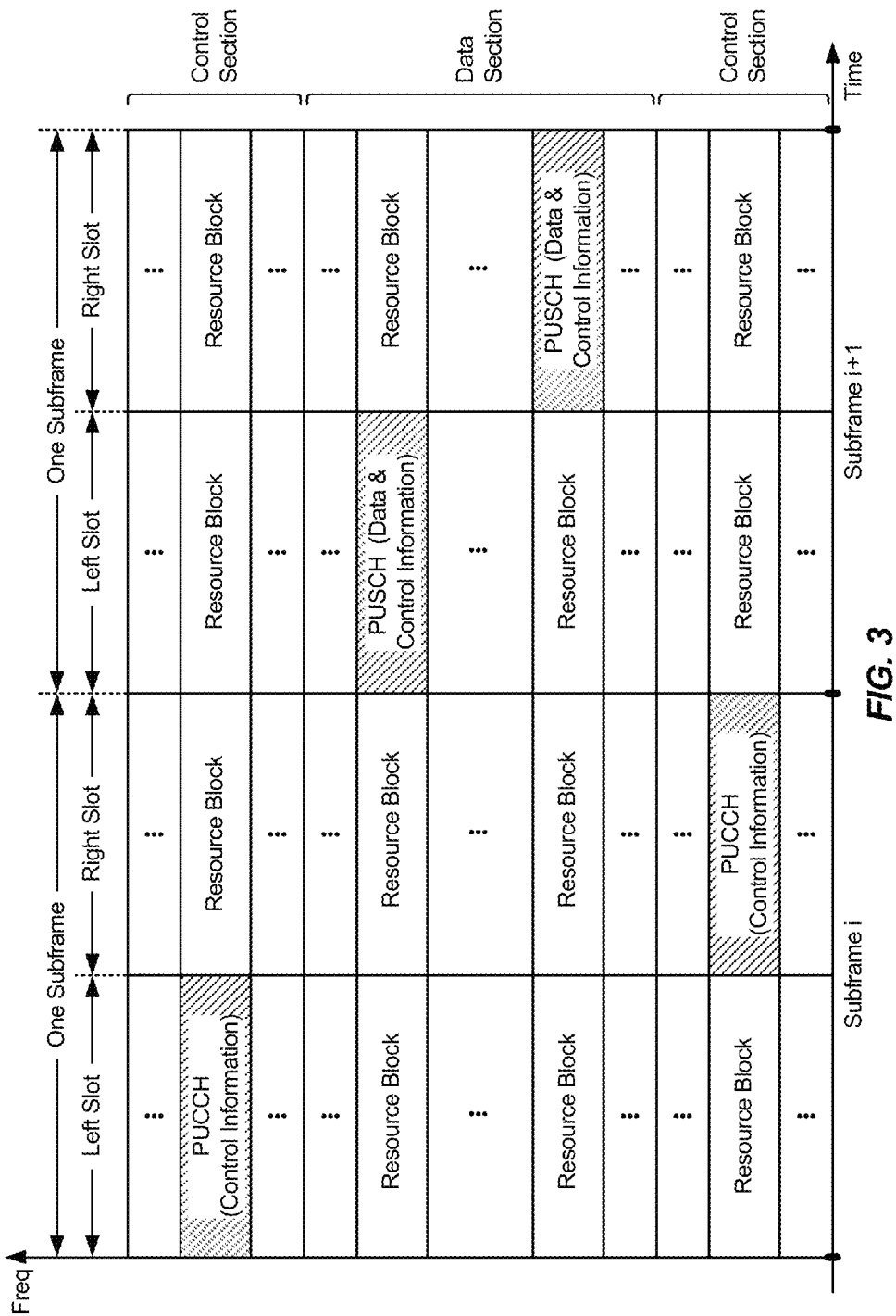
FIG. 3 is a block diagram conceptually illustrating an example frame structure in uplink communications.

FIG. 3 is a block diagram conceptually illustrating an exemplary FDD and TDD (non-special subframe only) subframe structure in uplink long term evolution (LTE) communications. The available resource blocks (RBs) for the uplink may be partitioned into a data section and a control section. The control section may be formed at the two edges of the system bandwidth and may have a configurable size. The resource blocks in the control section may be assigned to UEs for transmission of control information. The data section may include all resource blocks not included in the control section. The design in FIG. 3 results in the data section including contiguous subcarriers, which may allow a single UE to be assigned all of the contiguous subcarriers in the data section.

A UE may be assigned resource blocks in the control section to transmit control information to an eNodeB. The UE may also be assigned resource blocks in the data section to transmit data to the eNode B. The UE may transmit control information in a Physical Uplink Control Channel (PUCCH)

on the assigned resource blocks in the control section. The UE may transmit only data or both data and control information in a Physical Uplink Shared Channel (PUSCH) on the assigned resource blocks in the data section. An uplink transmission may span both slots of a subframe and may hop across frequency as shown in FIG. 3. According to one aspect, in relaxed single carrier operation, parallel channels may be transmitted on the UL resources. For example, a control and a data channel, parallel control channels, and parallel data channels may be transmitted by a UE.

The PSC, SSC, CRS, PBCH, PUCCH, PUSCH, and other such signals and channels used in LTE/-A are described in 3GPP TS 36.211, entitled "Evolved Universal Terrestrial Radio Access (E-UTRA); Physical Channels and Modulation," which is publicly available.

Figure 4:
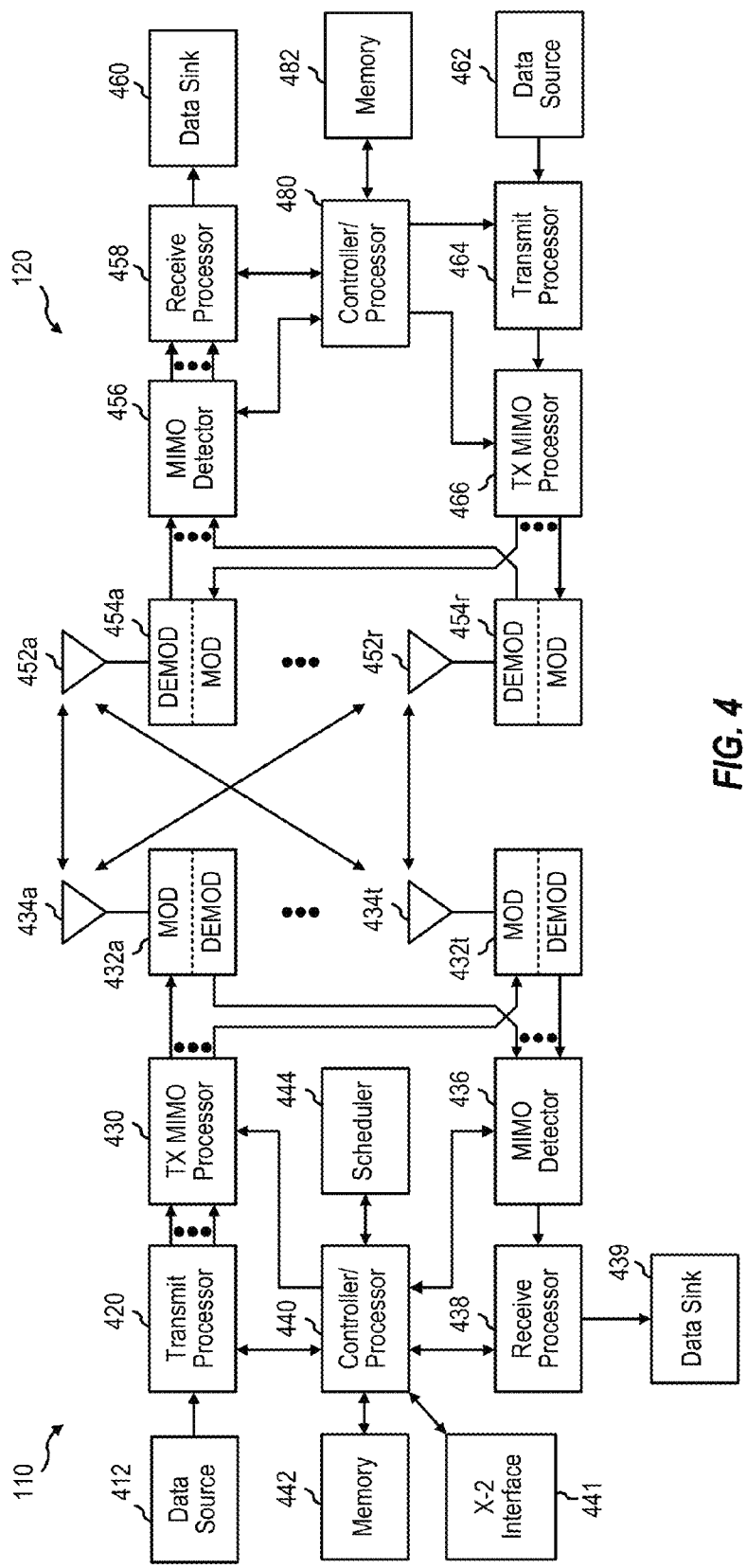
FIG. 4 is a block diagram conceptually illustrating a design of a base station/eNodeB and a UE configured according to one aspect of the present disclosure.

FIG. 4 shows a block diagram of a design of a base station/eNodeB 110 and a UE 120, which may be one of the base stations/eNodeBs and one of the UEs in FIG. 1. The base station 110 may be the macro eNodeB 110c in FIG. 1, and the UE 120 may be the UE 120y. The base station 110 may also be a base station of some other type. The base station 110 may be equipped with antennas 434a through 434t, and the UE 120 may be equipped with antennas 452a through 452r.

At the base station 110, a transmit processor 420 may receive data from a data source 412 and control information from a controller/processor 440. The control information may be for the PBCH, PCFICH, PHICH, PDCCH, etc. The data may be for the PDSCH, etc. The processor 420 may process (e.g., encode and symbol map) the data and control information to obtain data symbols and control symbols, respectively. The processor 420 may also generate reference symbols, e.g., for the PSS, SSS, and cell-specific reference signal. A transmit (TX) multiple-input multiple-output (MIMO) processor 430 may perform spatial processing (e.g., precoding) on the data symbols, the control symbols, and/or the reference symbols, if applicable, and may provide output symbol streams to the modulators (MODs) 432a through 432t. Each modulator 432 may process a respective output symbol stream (e.g., for OFDM, etc.) to obtain an output sample stream. Each modulator 432 may further process (e.g., convert to analog, amplify, filter, and upconvert) the output sample stream to obtain a downlink signal. Downlink signals from modulators 432a through 432t may be transmitted via the antennas 434a through 434t, respectively.

At the UE 120, the antennas 452a through 452r may receive the downlink signals from the base station 110 and may provide received signals to the demodulators (DEMODs) 454a through 454r, respectively. Each demodulator 454 may condition (e.g., filter, amplify, downconvert, and digitize) a respective received signal to obtain input samples. Each demodulator 454 may further process the input samples (e.g., for OFDM, etc.) to obtain received symbols. A MIMO detector 456 may obtain received symbols from all the demodulators 454a through 454r, perform MIMO detection on the received symbols if applicable, and provide detected symbols. A receive processor 458 may process (e.g., demodulate, deinterleave, and decode) the detected symbols, provide decoded data for the UE 120 to a data sink 460, and provide decoded control information to a controller/processor 480.

On the uplink, at the UE 120, a transmit processor 464 may receive and process data (e.g., for the PUSCH) from a data source 462 and control information (e.g., for the PUCCH) from the controller/processor 480. The processor 464 may also generate reference symbols for a reference signal. The symbols from the transmit processor 464 may be precoded by a TX MIMO processor 466 if applicable, further processed by the modulators 454a through 454r (e.g., for SC-FDM, etc.), and transmitted to the base station 110. At the base station 110, the uplink signals from the UE 120 may be received by the antennas 434, processed by the demodulators 432, detected by a MIMO detector 436 if applicable, and further processed by a receive processor 438 to obtain decoded data and control information sent by the UE 120. The processor 438 may provide the decoded data to a data sink 439 and the decoded control information to the controller/processor 440. The base station 110 can send messages to other base stations, for example, over an X2 interface 441.

The controllers/processors 440 and 480 may direct the operation at the base station 110 and the UE 120, respectively. The processor 440 and/or other processors and modules at the base station 110 may perform or direct the execution of various processes for the techniques described herein. The processor 480 and/or other processors and modules at the UE 120 may also perform or direct the execution of the functional blocks illustrated in method flow chart FIG. 6, and/or other processes for the techniques described herein. The memories 442 and 482 may store data and program codes for the base station 110 and the UE 120, respectively. A scheduler 444 may schedule UEs for data transmission on the downlink and/or uplink.

Heterogeneous Networks

Wireless networks may have eNodeBs of different power classes. For example, three power classes may be defined, in decreasing power class, as macro eNodeBs, pico eNodeBs, and femto eNodeBs. Networks featuring such different power class eNodeBs may be referred to as heterogeneous networks. When macro eNodeBs, pico eNodeBs, and femto eNodeBs are in a co-channel deployment, the power spectral density (PSD) of the macro eNodeB (aggressor eNodeB) may be larger than the PSD of the pico eNodeB and the femto eNodeB (victim eNodeBs) creating large amounts of interference with the pico eNodeB and the femto eNodeB. Protected subframes may be used to reduce or minimize interference with the pico eNodeBs and femto eNodeBs. That is, a protected subframe may be scheduled for the victim eNodeB to correspond with a prohibited subframe on the aggressor eNodeB.

Referring back to FIG. 1, the heterogeneous wireless network 100 uses the diverse set of eNodeBs 110 (i.e., macro eNodeBs, pico eNodeBs, femto eNodeBs, and relays) to improve the spectral efficiency of the system per unit area. The macro eNodeBs 110a-c are usually carefully planned and placed by the provider of the wireless network 100. The macro eNodeBs 110a-c generally transmit at high power levels (e.g., 5 W-40 W). The pico eNodeB 110x and the relay 110r, which generally transmit at substantially lower power levels (e.g., 100 mW-2 W), may be deployed in a relatively unplanned manner to eliminate coverage holes in the coverage area provided by the macro eNodeBs 110a-c and improve capacity in the hot spots. The femto eNodeBs 110y-z, which are typically deployed independently from the wireless network 100 may, nonetheless, be incorporated into the coverage area of the wireless network 100 either as a potential access point to the wireless network 100, if authorized by their administrator(s), or at least as an active and aware eNodeB that may communicate with the other eNodeBs 110 of the wireless network 100 to perform resource coordination and coordination of interference management. The femto eNodeBs 110y-z typically also transmit at substantially lower power levels (e.g., 100 mW-2 W) than the macro eNodeBs 110a-c.

In operation of a heterogeneous network, such as the wireless network 100, each UE is usually served by the eNodeB 110 with the better signal quality, while the unwanted signals received from the other eNodeBs 110 are treated as interference. While such operational principals can lead to significantly sub-optimal performance, gains in network performance are realized in the wireless network 100 by using intelligent resource coordination among the eNodeBs 110, better server selection strategies, and more advanced techniques for efficient interference management.

A pico eNodeB, such as the pico eNodeB 110x, is characterized by a substantially lower transmit power when compared with a macro eNodeB, such as the macro eNodeBs 110a-c. A pico eNodeB will also usually be placed around a network, such as the wireless network 100, in an ad hoc manner. Because of this unplanned deployment, wireless networks with pico eNodeB placements, such as the wireless network 100, can be expected to have large areas with low signal to interference conditions, which can make for a more challenging RF environment for control channel transmissions to UEs on the edge of a coverage area or cell (a "cell-edge" UE). Moreover, the potentially large disparity (e.g., approximately 20 dB) between the transmit power levels of the macro eNodeBs 110a-c and the pico eNodeB 110x implies that, in a mixed deployment, the downlink coverage area of the pico eNodeB 110x will be much smaller than that of the macro eNodeBs 110a-c.

In the uplink case, however, the signal strength of the uplink signal is governed by the UE, and, thus, will be similar when received by any type of the eNodeBs 110. With the uplink coverage areas for the eNodeBs 110 being roughly the same or similar, uplink handoff boundaries will be determined based on channel gains. This can lead to a mismatch between downlink handover boundaries and uplink handover boundaries. Without additional network accommodations, the mismatch would make the server selection or the association of UE to eNodeB more difficult in the wireless network 100 than in a macro eNodeB-only homogeneous network, where the downlink and uplink handover boundaries are more closely matched.

In deployments of heterogeneous networks, such as the wireless network 100, a UE may operate in a dominant interference scenario in which the UE may observe high interference from one or more interfering eNodeBs. A dominant interference scenario may occur due to restricted association. For example, in FIG. 1, the UE 120y may be close to the femto eNodeB 110y and may have high received power for the eNodeB 110y. However, the UE 120y may not be able to access the femto eNodeB 110y due to restricted association and may then connect to the macro eNodeB 110c (as shown in FIG. 1) or to the femto eNodeB 110z also with lower received power (not shown in FIG. 1). The UE 120y may then observe high interference from the femto eNodeB 110y on the downlink and may also cause high interference to the eNodeB 110y on the uplink. Using coordinated interference management, the eNodeB 110c and the femto eNodeB 110y may communicate over the backhaul to negotiate resources. In the negotiation, the femto eNodeB 110y agrees to cease transmission on one of its channel resources, such that the UE 120y will not experience as much interference from the femto eNodeB 110y as it communicates with the eNodeB 110c over that same channel.

In addition to the discrepancies in signal power observed at the UEs in such a dominant interference scenario, timing delays of downlink signals may also be observed by the UEs, even in synchronous systems, because of the differing distances between the UEs and the multiple eNodeBs. The eNodeBs in a synchronous system are presumptively synchronized across the system. However, for example, considering a UE that is a distance of 5 km from the macro eNodeB, the propagation delay of any downlink signals received from that macro eNodeB would be delayed approximately 16.67 µs (5 km÷3×108, i.e., the speed of light, 'c'). Comparing that downlink signal from the macro eNodeB to the downlink signal from a much closer femto eNodeB, the timing difference could approach the level of a time tracking loop (TTL) error.

Enhanced Adaptive Gain Control in Heterogeneous Networks

Adaptive gain control (also called automatic gain control, or AGC) is a technique to adjust the power level for a range of input signals to assist in processing those input signals when there is a large dynamic range, i.e., difference in power levels among the input signals. That is certain signals may have a very high received power but others may have a very low received power. Adaptive gain control may be particularly useful in heterogeneous networks where different base stations of different power classes are deployed in the same network and are handling signals from different user mobile devices of varying received signal strength. Adaptive gain control may be used to adjust incoming signals to an improved or optimal operation point for further processing by a receiver.

In an LTE UE or eNodeB, adaptive gain control may be used where received signals vary in strength over time, i.e., bursty traffic that is strong during certain times but weak during others. Adaptive gain control may be used to adjust the signal of such bursty traffic over time. A UE or eNodeB may also receive a mix of strong and weak signals from different users multiplexed in the same subframe. Adaptive gain control may also be used to adjust these multiplexed signals so the strong signal is not saturated and the weak signal is not suppressed. In the presence of strong interference, the adaptive gain control should not be driven by the interference such that the useful signal gets suppressed. Such signal variations are common in heterogeneous network scenarios.

Proposed are adaptive gain control schemes to adjust for various signal conditions. Such schemes include an outer loop adaptive gain control (AGC), non-causal AGC prior to a fast Fourier transform (FFT) of a digital variable gain amplifier, non-causal AGC after a FFT of a digital variable gain amplifier, and non-causal AGC for each channel of a digital variable gain amplifier. In causal AGC, samples are adjusted based on power levels of preceding samples. In non-causal AGC, samples are adjusted based on their own power levels. For example, the first few symbols of a one millisecond sample could be analyzed to adjust the remaining symbols of that same sample.

In one aspect of the present disclosure, a first gain control unit is placed before a processing block (such as a direct Fourier transform (DFT) block or FFT block) and a second gain control unit after the processing block. The first gain control unit operates at a first update rate and the second gain control unit operates at a second update rate. The gain adjustment factor from the first gain control unit may be forwarded to the second gain control unit which uses the factor to invert the gain adjustment so that the combined gain adjustment follows a third update rate. The third update rate is slower than the second update rate. A gain control unit may select a predetermined subset of the input signal samples based on known signal timing. The subset is contained in an orthogonal frequency-division multiplexing (OFDM) symbol but is not equal to the entire OFDM symbol.

For example, a first update rate before an FFT block may be per symbol (i.e. every 0.07 ms). Gain may be adjusted by a common gain G1, and relative gains of g0, g1, g2, g3, g4, g5, and g6. Total gain before the FFT may be G+g0 for a first symbol, G+g1 for a second symbol, etc. g0 may be set to 0 as later gains may be relative to the first symbol. A second update rate may be per slot (i.e. every 0.5 ms) or per subframe (i.e. every 1 ms) depending on factors such as existence of frequency hopping. A common gain G2 may be applied for the second level. For further processing, per-symbol variation introduced by the AGC may not be desired. To remove the relative gain across the symbols, g0, g1, g2 . . . g6 may be inverted. A third update rate may apply these inverted relative gains to remove the per symbol variation. The relative symbol level adjustments of g0 . . . g6 are typically smaller than the global adjustments of G1 and G2. Following these three steps an eNodeB may perform further per channel scaling.

Outer loop/analog AGC ensures an incoming signal is within a desired operating range of a receiver. The received signal level is raised or lowered by adjusting the receiver amplification. The analog AGC protects an analog-to-digital converter from saturating at high signal levels and prevents distortion for non-linear devices (such as mixers) when operating at high signal power. When performing AGC, a boundary may be set on the post-AGC signal power to allow for potential rapid spikes or drops in pre-AGC signal power. The boundary may allow these signals to also be processed to have a power within the operating range of the receiver. The desired operating range may be in a low power scale to assist processing of the received signals. AGC may be based on an average power of a received signal over a certain period of time. That period of time may be chosen to adjust how quickly or slowly the AGC adjusts. An example range of such time periods may be 30 ms to 100 ms.

Figure 5:
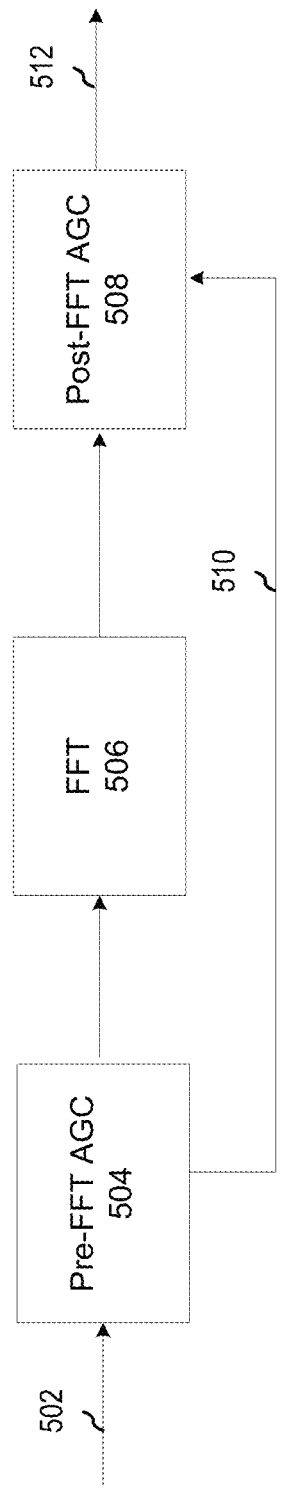
FIG. 5 is a block diagram illustrating an exemplary circuit design for adaptive gain control according to one aspect of the present disclosure.

Non-causal/digital AGC may also be implemented prior to an FFT block (i.e., in the time domain) in an operating circuit. In this manner an incoming signal is adjusted to a desired operating range of the FFT. FIG. 5 is a block diagram illustrating a circuit design for adaptive gain control according to one aspect of the present disclosure. An incoming signal is input 502 into a pre-FFT adaptive gain control module 504. The AGC module 504 may include a digital variable gain amplifier or similar components. The adjusted signal is then passed to an FFT module 506. The pre-FFT AGC is non-causal, i.e., signals may be adjusted by their own power level. This particular approach may provide good performance for situations with bursty traffic and variable strong interference (i.e., interference that varies in time with the useful signal).

Such pre-FFT AGC may be implemented by accumulating the power of time domain signal samples for each symbol prior to the FFT. A symbol is a portion of the received signal. Each one ms of received signal contains 14 symbols. The AGC processing may exclude portions of the signal adjacent to possible signal transition boundaries, such as some head or tail samples (i.e., samples taken at the beginning or ending of the signal), as those samples have a higher probability of experiencing interference due to multipath delays or timing errors. Thus, the center of the symbols may be measured. The accumulation of the power of the samples may then be compared with a set point and scaled accordingly through AGC to reach the desired FFT operating range. The accumulation may be the sum of the absolute value squared of the signal samples.

In one aspect, a simplified scaling may include comparing a most significant bit position of a power sample or power sample average to a set point and finding the difference between the two. For example, if a power signal average is 64, the most significant bit position would be 6 ($2^6$=64), if the power signal average is 128, the most significant bit position would be 7 ($2^7$=128). If the difference between the power sample most significant bit position and the set point is positive (i.e., the signal sample is above the set point), the signal may be scaled down. If the difference is negative (i.e., the signal sample is below the set point), the signal may be scaled up. This AGC adjustment may be implemented in hardware in parallel with other operations to reduce the ultimate number of clock cycles for processing the signal.

In one aspect, to improve AGC speed, a bit shift operation may be used in lieu of expanded multiplication of the signal power by a scaling factor. For example, if a received signal power is approximately ¼ of a desired power, the signal may be left bit-shifted by one bit, effectively multiplying it by two and increasing the power by a factor of four. Such bit shifting may be used when processing speed is more important than precise power adjustment.

Non-causal/digital AGC may also be implemented after an FFT block (in the frequency domain) in an operating circuit. AGC scaling of different symbols may be consistent within a particular time slot to avoid inaccurate channel estimation. As shown in FIG. 5, a post-FFT AGC module 508 is positioned after the FFT module 506. The AGC module 508 may include a digital variable gain amplifier or similar components. Once post-FFT AGC has been performed, the scaled signals 512 is then passed to the next component of a circuit. Post-FFT AGC may be performed to undo the per symbol scaling of a pre-FFT AGC operation. To that end, a feed forward mechanism 510 may connect the pre-FFT AGC module 504 and the post-FFT AGC module 508. The feed forward mechanism 510 passes information related to the pre-FFT time domain AGC to the post-FFT frequency domain module AGC 508 for appropriate processing.

Post-FFT AGC may be implemented by performing AGC in an inverted approach relative to the pre-FFT AGC. That is, if the signals in the symbol are scaled up before FFT, they are scaled down by the same scaling factor after FFT. Similarly, if the signals in the symbol are scaled down before FFT, they are scaled up by the same scaling factor after FFT.

To account for different bit sizes representing the signal pre and post FFT, the set point after the FFT may be different than the set point pre-FFT. For example, if 16 bits are used pre-FFT but only 6 or 9 bits are used post-FFT, the scaling may be adjusted accordingly to ensure proper representation of the signal. This scaling may be based on a first symbol of a one ms time period. In other words, the scaling to adjust the represented signal power from one bit sized representation to another is based on a first symbol of a one ms time period, and the remaining 13 symbols of the one ms time period are scaled based on the same factor that was applied for the first symbol.

Additionally, following post-FFT scaling of the first symbol, each symbol of a one ms time period after the first symbol may be scaled by a differential factor relative to the first symbol of the one ms time period. That is, any bit shifts of later symbols compared to the first symbol performed before the FFT will be inverted and adjusted after the FFT. For example, if during a pre-FFT scaling a first symbol is bit shifted left by one bit, a second symbol is bit shifted left by two bits, a third symbol is bit shifted left by three bits, etc., after the FFT the second symbol will be bit shifted right by one bit (the inverse of the differential between the pre-FFT shift of the first symbol and second symbol) and the third symbol will be bit shifted right by two bits (the inverse of the differential between the pre-FFT shift of the first symbol and third symbol). This post-FFT differential shift between a first symbol and later symbols ensures that after the post-FFT scaling performed to align all the symbols, each symbol is then properly aligned individually relative to the first symbol.

This differential scaling may also be performed by scaling power levels directly instead of through bit-shifting multiplication. For example, if between the first symbol and second symbol, the pre-FFT time domain gain control increased the gain by one dB, the post-FFT frequency domain gain control will scale down the second symbol by one dB compared with the first symbol.

For an eNodeB, non-causal AGC may also be implemented for each channel. Channel specific AGC may be performed by adjusting a frequency domain channel (such as a Physical Uplink Shared Channel (PUSCH), a Physical Uplink Control Channel (PUCCH), or sounding reference signals (SRS)) from different users. This adjusting may occur after de-multiplexing to adjust the individual channel-specific signals to a desired operation range of the receiver. When channels are multiplexed from different users, a most powerful signal will not be saturated and a least powerful signal will not be suppressed. When strong interference appears in a single subframe but not across frequency bands, useful signals will not be suppressed by the interference.

Per-channel AGC may be implemented as follows. A first step may be to accumulate power across all tones and all symbols of a particular slot. (A first and/or last symbol of a channel, except SRS, may be eliminated due to a higher probability of interference.) Alternatively, a first step may be to accumulate power across all tones and all symbols of each resource block of a particular slot. In one configuration, the maximum power across all resource blocks is determined. A second step may then compare the accumulation or maximum power with a set point and scale the signals accordingly. A simplified scaling may include comparing a most significant bit of a sample to a set point and finding the difference between the two. If the difference is positive (i.e., the signal sample is above the set point), the signal is scaled down. If the difference is negative (i.e., the signal sample is below the set point), the signal is scaled up. This AGC adjustment may be implemented in hardware in parallel with other operations (such as putting post-FFT samples into memory, reading them out, and sending them to the next processor step) to reduce the ultimate number of clock cycles for processing the signal.

The above AGC implementations may be used to improve LTE UE and eNodeB processing, for example to make the devices more robust to bursty traffic, multiple user multiplexing, and interference variations. The above AGC may be implemented in a variety of wireless communication networks, for example, FDD-LTE and TDD-LTE.

In the above examples, a Fast Fourier Transform (FFT) and FFT block are used for illustrative purposes, however other domain switching transforms such as a Direct Fourier Transform (DFT), and corresponding modules such as a DFT module, may be used instead of FFT.

Figure 6:
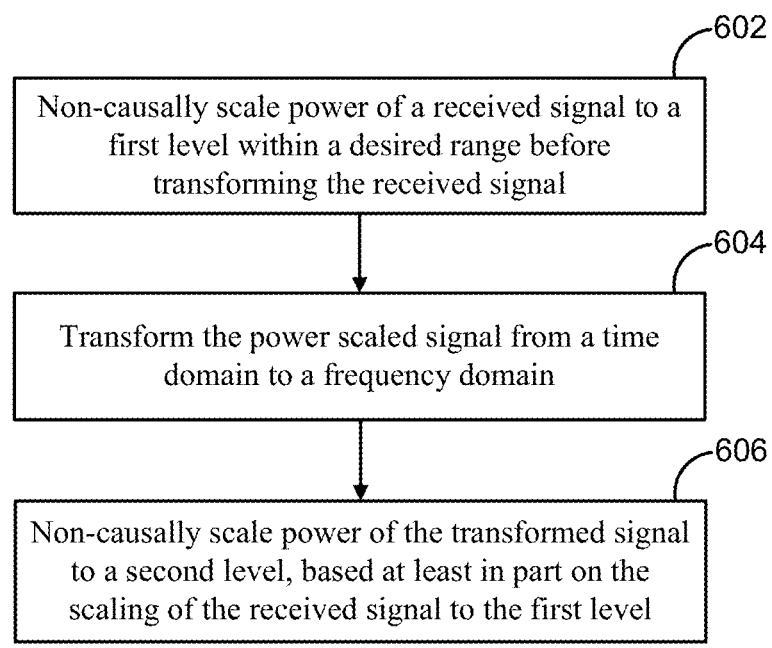
FIG. 6 is a block diagram illustrating a method for adaptive gain control according to one aspect of the present disclosure.

FIG. 6 illustrates a method for performing adaptive gain control according to one aspect of the present disclosure. An eNode B non-causally scales power of a received signal to a first level within a desired range before transforming the received signal, as shown in block 602. An eNodeB transforms the power scaled signal from a time domain to a frequency domain, as shown in block 604. The eNodeB non-causally scaling power of the transformed signal to a second level, based at least in part on the scaling of the received signal to the first level, as shown in block 606.

In one configuration, an eNodeB 110 is configured for wireless communication including means for non-causally scaling power of a received signal, transforming the power scaled signal, and non-causally scaling power of the transformed signal. In one aspect, the means may be the Pre-FFT AGC 504, the FFT 506, the Post-FFT AGC 508, and demodulators 432 and 454. In another aspect, the aforementioned means may be a module or any apparatus configured to perform the functions recited by the aforementioned means.

Figure 7:
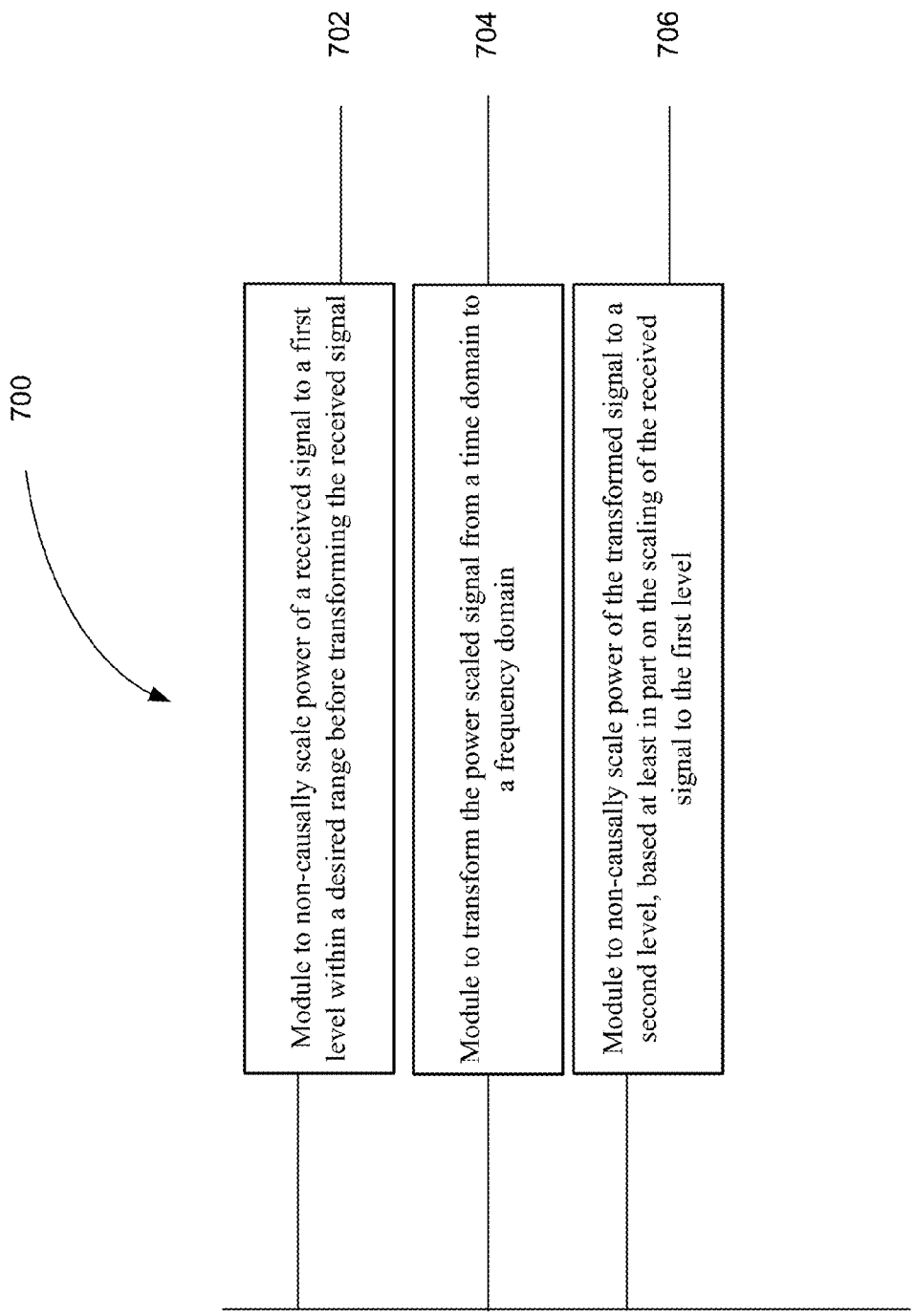
FIG. 7 is a block diagram illustrating components for adaptive gain control according to one aspect of the present disclosure.

FIG. 7 shows a design of an apparatus 700 for an eNodeB, such as the eNodeB 110 of FIG. 4. The apparatus 700 includes a module 702 to non-causally scale power of a received signal to a first level within a desired range before transforming the received signal. The apparatus 700 also includes a module 704 to transform the power scaled signal from a time domain to a frequency domain. The apparatus 700 also includes a module 706 to non-causally scale power of the transformed signal to a second level, based at least in part on the scaling of the received signal to the first level. The modules in FIG. 7 may be processors, electronics devices, hardware devices, electronics components, logical circuits, memories, software codes, firmware codes, etc., or any combination thereof.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A method for automatic gain control (AGC) in wireless communications, the method comprising:
    non-causally scaling power of a received signal to a first level within a desired range before transforming the received signal, in which the power scaling of the received signal to the first level occurs in a digital domain;
    transforming the power scaled signal from a time domain to a frequency domain; and
    non-causally scaling power of the transformed signal to a second level, based at least in part on the scaling of the received signal to the first level, in which the power scaling of the transformed signal to the second level occurs in the digital domain.

2. The method of claim 1 in which scaling power of the transformed signal to the second level is based at least in part on a feed forward signal from a circuit module scaling power of the received signal to the first level.

3. The method of claim 1 further comprising dividing the received signal into different portions prior to adjusting power of the received signal, power of the different portions being adjusted independently of other portions.

4. The method of claim 3 in which the different portions are separated on a per-channel basis.

5. The method of claim 1 further comprising removing at least one of a head portion and a tail portion of the received signal prior to determining a level for scaling power of the received signal.

6. The method of claim 1 in which scaling power of the transformed signal to the second level is performed on a symbol-by-symbol basis based at least in part on scaling power of the received signal to the first level of a corresponding symbol.

7. The method of claim 1 in which scaling power of the transformed signal to the second level operates at a first update rate and scaling power of the transformed signal to the second level operates at a second update rate that is slower than the first update rate.

8. The method of claim 7 in which a per symbol gain is applied to each symbol at the second level.

9. The method of claim 8 in which an inverse per symbol gain is applied to each symbol at a level after the second level, the inverse per symbol gain being the inverse, on a symbol level, of the per symbol gain applied to each symbol at the second level.

10. The method of claim 1 in which the first level comprises multiple levels for different symbols.

11. The method of claim 1 in which the second level comprises multiple levels for difference channels.

12. An apparatus for automatic gain control (AGC) in wireless communication comprising:
    means for non-causally scaling power of a received signal to a first level within a desired range before transforming the received signal, in which the power scaling of the received signal to the first level occurs in a digital domain;
    means for transforming the power scaled signal from a time domain to a frequency domain; and
    means for non-causally scaling power of the transformed signal to a second level, based at least in part on the scaling of the received signal to the first level, in which the power scaling of the transformed signal to the second level occurs in the digital domain.

13. A computer program product for automatic gain control (AGC) in wireless communication in a wireless network, comprising:
    a non-transitory computer-readable medium having non-transitory program code recorded thereon, the non-transitory program code comprising:
    program code to non-causally scale power of a received signal to a first level within a desired range before transforming the received signal, in which the power scaling of the received signal to the first level occurs in a digital domain;
    program code to transform the power scaled signal from a time domain to a frequency domain; and
    program code to non-causally scale power of the transformed signal to a second level, based at least in part on the scaling of the received signal to the first level, in which the power scaling of the transformed signal to the second level occurs in the digital domain.

14. An apparatus for automatic gain control (AGC) in wireless communication, comprising:
    a memory; and
    at least one processor coupled to the memory, the at least one processor being configured:
    to non-causally scale power of a received signal to a first level within a desired range before transforming the received signal, in which the power scaling of the received signal to the first level occurs in a digital domain;
    to transform the power scaled signal from a time domain to a frequency domain; and
    to non-causally scale power of the transformed signal to a second level, based at least in part on the scaling of the received signal to the first level, in which the power scaling of the transformed signal to the second level occurs in the digital domain.

15. The apparatus of claim 14 in which scaling power of the transformed signal to the second level is based at least in part on a feed forward signal from a circuit module scaling power of the received signal to the first level.

16. The apparatus of claim 14 in which the at least one processor is further configured to divide the received signal into different portions prior to adjusting power of the received signal, power of the different portions being adjusted independently of other portions.

17. The apparatus of claim 16 in which the different portions are separated on a per-channel basis.

18. The apparatus of claim 14 in which the at least one processor is further configured to remove at least one of a head portion and a tail portion of the received signal prior to determining a level for scaling power of the received signal.

19. The apparatus of claim 14 in which the at least one processor is further configured to perform scaling power of the transformed signal to the second level on a symbol-by-symbol basis based at least in part on scaling power of the received signal to the first level of a corresponding symbol.

20. The apparatus of claim 14 in which the at least one processor is further configured to operate scaling power of the transformed signal to the second level at a first update rate and operate scaling power of the transformed signal to the second level at a second update rate that is slower than the first update rate.

21. The apparatus of claim 20 in which a per symbol gain is applied to each symbol at the second level.

22. The apparatus of claim 21 in which the at least one processor is further configured to apply an inverse per symbol gain to each symbol at a level after the second level, the inverse per symbol gain being the inverse, on a symbol level, of the per symbol gain applied to each symbol at the second level.

23. The apparatus of claim 14 in which the first level comprises multiple levels for different symbols.

24. apparatus of claim 14 in which the second level comprises multiple levels for difference channels.

* * * * *